United States Patent [19]

Williams

[11] Patent Number: 5,278,636
[45] Date of Patent: Jan. 11, 1994

[54] NON-VOLATILE, SOLID STATE BISTABLE ELECTRICAL SWITCH

[75] Inventor: Roger M. Williams, Asuza, Calif.

[73] Assignee: The United States of America as represented by the Administrator of the National Aeronautics and Space Administration, Washington, D.C.

[21] Appl. No.: 654,439

[22] Filed: Jan. 28, 1991

Related U.S. Application Data

[63] Continuation of Ser. No. 414,820, Sep. 29, 1989, abandoned.

[51] Int. Cl.$^5$ ............................................. H01L 45/00
[52] U.S. Cl. ................................... 257/2; 307/201; 338/13; 338/38; 361/500; 257/528
[58] Field of Search ............... 357/2, 51; 307/201; 338/13, 38; 361/500

[56] References Cited

U.S. PATENT DOCUMENTS

| | | | |
|---|---|---|---|
| 1,863,253 | 6/1930 | Polin | 357/2 |
| 3,540,006 | 10/1970 | Lauer | 340/173 |
| 3,908,148 | 9/1975 | Lehrer | 313/398 |
| 4,020,443 | 4/1977 | LeRoy et al. | 338/28 |
| 4,163,982 | 8/1979 | Di Domenico, Jr. et al. | 357/2 |
| 4,187,530 | 2/1980 | Singh et al. | 357/2 |
| 4,253,742 | 3/1981 | Morita | 350/357 |
| 4,945,257 | 7/1990 | Marrocco, III | 307/201 |

Primary Examiner—Andrew J. James
Assistant Examiner—Sara W. Crane
Attorney, Agent, or Firm—Thomas H. Jones; John R. Manning; Guy M. Miller

[57] ABSTRACT

A bistable switching element is made of a material whose electrical resistance reversibly decreases in response to intercalation by positive ions. Flow of positive ions between the bistable switching element and a positive ion source is controlled by means of an electrical potential applied across a thermal switching element. The material of the thermal switching element generates heat in response to electrical current flow therethrough, which in turn causes the material to undergo a thermal phase transition from a high electrical resistance state to a low electrical resistance state as the temperature increases above a predetermined value. Application of the electrical potential in one direction renders the thermal switching element conductive to pass electron current out of the ion source. This causes positive ions to flow from the source into the bistable switching element and intercalate the same to produce a non-volatile, low resistance logic state. Application of the electrical potential in the opposite direction causes reverse current flow which de-intercalates the bistable switching element and produces a high resistance logic state.

20 Claims, 4 Drawing Sheets

NON-VOLATILE, SOLID STATE BISTABLE ELECTRICAL SWITCH

ORIGIN OF THE INVENTION

The invention described herein wad made the performance of work under a NASA contract, and is subject to the provisions of Public Law 96-517 (35 USC 202) in which the Contractor has elected not to retain title.

This is a continuation of application Ser. No. 414,820, filed Sep. 29, 1989, now abandoned.

TECHNICAL FIELD

The present invention relates to a non-volatile, solid state, bistable electrical switch.

DESCRIPTION OF THE RELATED ART

Bistable switches used as binary memory elements in electronic digital computer circuits and the like are generally volatile. A typical example is an electronic "flip-flop" type device which loses its memory content when the system power is removed. Such elements also require more than two terminals for supplying operating power, and reading and writing of data.

Attempts have been made to fabricate materials which are physically switchable between high and low electrical resistance states in response to applied voltages. However, these materials are unsatisfactory in that the switch states are not indefinitely stable, and/or that they cannot be easily erased.

U.S. Pat. No, 4,163,982, issued Aug. 7, 1979, entitled "SOLID STATE ELECTRICAL SWITCH EMPLOYING ELECTROCHROMIC MATERIAL", to Di Domenico, Jr. et al, discloses a switch arrangement including an electrochromic material such as tungsten trioxide which undergoes a transformation from insulator to metallic conductor on injection of certain ions. The transformation is reversible, in that the insulative state is restored by removal of the ions from the electrochromic material. A switch configuration is provided by connecting contacts across the material. The switch is turned on (closed) by injecting ions from an ion source into the material, and turned off (opened) by causing the ions to flow from the material back into the source. A major advantage of this arrangement is that the material, once rendered conductive by injection of ions, remains in the conductive state until the ions are removed. The material will stably remain in either state indefinitely, without any external power being needed to retain the data.

Ions are caused to flow from the source into the switch material by application of an external electrical potential in one direction, and in the opposite direction by reversing the electrical potential. The device therefore requires four terminals; two for a switching signal which causes the device to change states; and two for an output load which is controlled by the conductive state of the switch.

STATEMENT OF THE INVENTION

The present invention provides a two-terminal solid state memory switch that may be written on, read, and erased by applying voltages of varying magnitudes and opposite polarities. The switch includes a novel structure employing a thermal phase transition to control ion conduction to or from an electrically intercalatable material with electronic conductivity dependent upon the level of intercalation. The switch can be applied to ordinary computers, and to neural network computers with characteristics similar to existing Random Access Memories (RAMs). In the latter case, the present switch can provide an erasable, non-volatile, synapse memory element, capable of high packing density.

The present switch includes a bistable switching element made of a material whose electrical resistance reversibly decreases in response to intercalation by positive ions. Flow of positive Ions between the bistable switching element and a positive ion source is controlled by means of an electrical potential applied across a thermal switching element. The material of the thermal switching element generates heat in response to electrical current flow therethrough, which in turn causes the material to undergo a thermal phase transition from a high electrical resistance state to a low electrical resistance state as the temperature increases above a predetermined value. Application of the electrical potential in one direction renders the thermal switching element conductive to pass electron current out of the ion source. This causes positive ions to flow from the source into the bistable switching element and intercalate the same to produce a non-volatile, low resistance logic state. Application of the electrical potential in the opposite direction causes reverse current flow which de-intercalates the bistable switching element and produces a high resistance logic state.

The present invention specifically improves over the basic switch disclosed in the above referenced patent to Di Domenico in that only two terminals are required for both switching and load control. When a large enough positive voltage is applied across the switch, the thermal element heats up enough to switch into its high conductivity state due to current flow therethrough, and the ion source is stimulated to cause a flow of ions into the bistable switching element. This turns on the bistable switching element, which interconnects the terminals through a circuit path which may include a resistor. Removal of the high writing voltage does not erase the memory, for even though the thermal switching element returns to its non-conducting state, the ion source no longer produces ions, and the bistable switching element has been intercalated with sufficient positive ions to remain conductive. Thus, the memory state is non-volatile, and information stored in it will remain even without power.

To read the information stored in the memory, a lower voltage of the same polarity is applied. A significant flow of current through the device indicates the conductive state, and vice-versa.

To erase the memory, or switch to the other bistable state, a larger voltage of the opposite polarity is applied, which turns on the thermal switching element, and causes ionic current to flow from the bistable switching element back into the source. This removes the positive ions from the bistable switching element, which is no longer intercalated, and reverts to its poorly conducting state, where it remains even after the switching voltage is removed.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
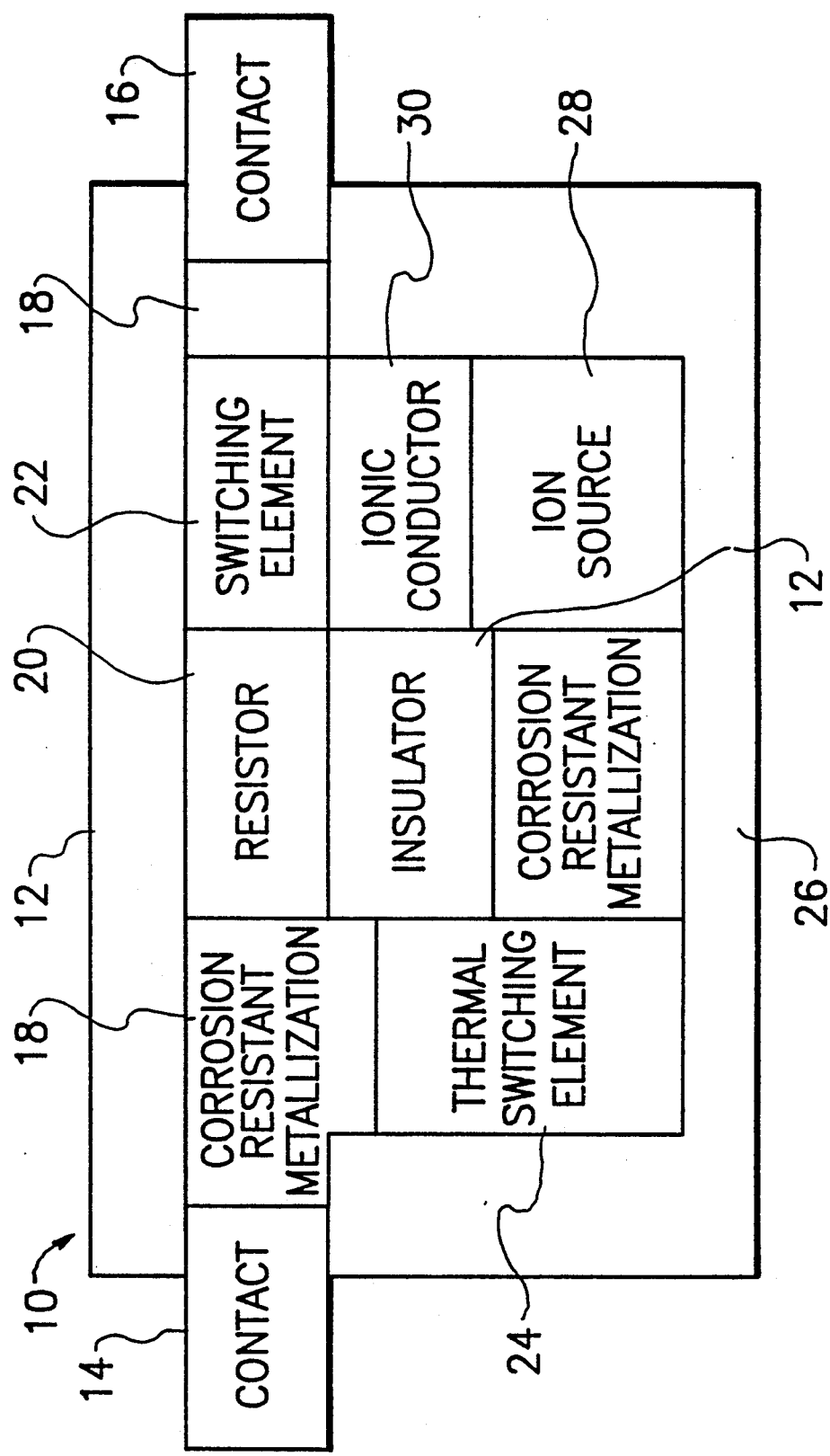
FIG. 1 is a block diagram of a first embodiment of a non-volatile solid state bistable electrical switch according to the present invention.

Referring now to FIG. 1 of the drawing, a non-volatile, solid state bistable electrical switch embodying the present invention is generally designated as 10 and includes an electrically insulative substrate 12 on which the other elements of the switch are deposited in the form of layers. First and second electrically conductive contacts or terminals 14 and 16 respectively carry electrical signals to the switch. The terminals 14 and 16 are electrically connected in series in a first circuit path which includes corrosion resistant metallization 18, a resistance element or resistor 20, and a bistable switching element 22.

A second circuit path between the terminals 14 and 16 includes a series connection of a thermal switching element 24, a corrosion resistant metallization 26, an ion source 28, and an ionic conductor 30 which is connected to another portion of the bistable switching element 22. The first and second circuit paths are electrically isolated from each other by the insulative substrate 12.

The resistor 20 conducts electrons in the usual manner. The ionic conductor 30 conducts positive ions, but blocks electron flow. The thermal switching element 24 is made of a material which generates heat in response to electrical current flow therethrough, and decreases in electrical resistance as the temperature increases. Preferably, the material of the thermal switching element 24 further exhibits a phase transition from a high electrical resistance state to a low electrical resistance state as the temperature thereof increases above room temperature, or at least above approximately 30° C.

The ion source 28 is made of a material which causes positive ions, preferably sodium ions, to flow therefrom into the bistable switching element 22, upon flow of electrons therefrom to the thermal switching element 24. The ion source 28 is a good conductor of ions and electrons at all states of the switch 10. Because of the possibility of corrosion due to the electropotential difference between the ion source 28 and the thermal switching element 24, the corrosion resistant metallization 26 is interposed therebetween. Similarly, corrosion resistant metallization 18 is interposed between the terminal 14, and thermal switching element 24 and resistor 20; and between the bistable switching element 22 and terminal 16. The terminals or contacts 14 and 16 are each made of a corrosion resistant metal, and the sole function of the metallizations 18 and 26 is to enable current flow between the respective elements of the switch 10.

In operation, a low resistance logic state is written into the switch 10 by applying a relatively high electrical potential between the terminals 14 and 16 in a direction which renders the terminal 14 positive relative to the terminal 16. Current flow through the switch 10 is initially very low, since the bistable switching element 22 and thermal switching element 24 are in their high electrical resistance states and pass only small amounts of leakage current therethrough. However, electron current flow from the ion source 28 through the thermal switching element 24 to the terminal 14 progressively causes the temperature of the thermal switching element 24 to rise and the electrical resistance of the element 24 to decrease. When the temperature of the element 24 reaches its thermal phase transition point, the element 24 undergoes a transition from the high electrical resistance state to a low electrical resistance state. This causes a much larger value of electron current to flow from the ion source 28 through the thermal switching element 24 into the terminal 14.

Electron flow out of the ion source 28 causes positive ions to flow out of the source 28 through the ionic conductor 30 into the bistable switching element 22. These ions intercalate the element 22, causing the electrical resistance thereof to decrease to a low value. The resistance of the element 22 will remain low for an indefinite period of time after the switching voltage or potential is removed from across the terminals 14 and 16, and the thermal switching element 24 returns to its high resistance state.

With the resistance of the bistable switching element 22 low, a sensing or reading signal applied across the terminals 14 and 16 to read the state of the switch 10 will sense a resistance value which is slightly more than that of the resistor 20. The sensing voltage may be much lower than the switching voltage, and may be of either polarity. This constitutes a logically low resistance or "closed" state of the switch 10.

The switch 10 may be switched to the high resistance or "open" state by applying a potential between the terminals 14 and 16 which renders the terminal 14 negative with respect to the terminal 16. The voltage for switching from the closed state to the open state must necessarily be larger than in the opposite direction, since the resistance of the first circuit path including the resistor 20 and bistable switching element 22 is low, and a greater voltage must be applied to cause sufficient current to flow through the second circuit path to heat up the thermal switching element 24 to its low resistance state.

The negative voltage applied to the terminal 14 causes electrons to flow through the thermal switching element 24 into the ion source 28, which in turn causes positive ions to flow from the bistable switching element 22 into the ion source 28. This has the effect of de-intercalating the element 22, which reverts back to its high resistance state. Application of a sensing or reading signal between the terminals 14 and 16 with the switch 10 in the closed state will sense a high resistance value, due to the high resistance of the element 22.

Figure 2:
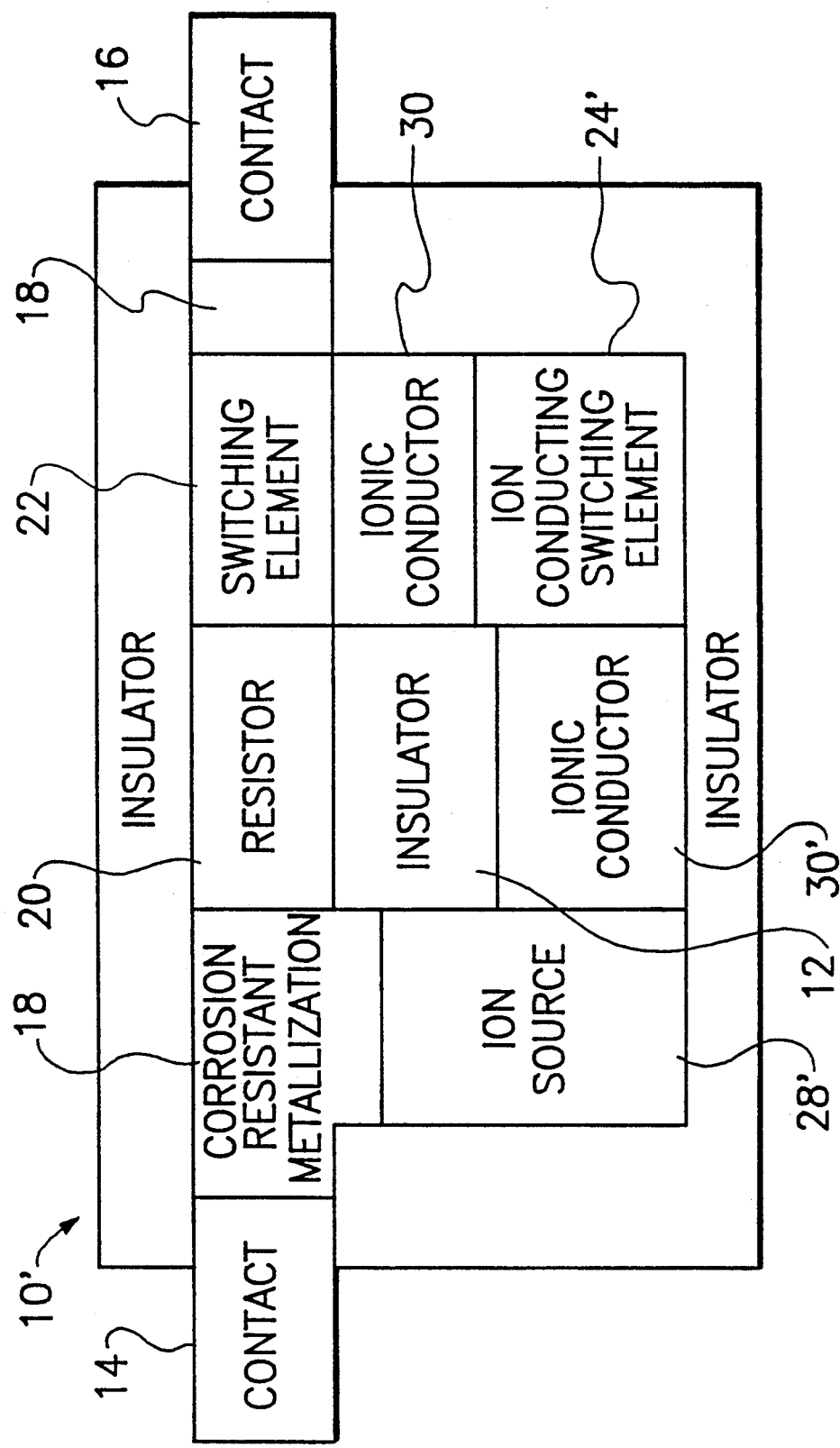
FIG. 2 is similar to FIG. 1, but illustrates a second embodiment of a switch according to the invention.

An alternative bistable switch 10' embodying the present invention is illustrated in FIG. 2, in which like elements are designated by the same reference numerals, and similar by modified elements are designated by the same reference numerals primed. The switch 10' differs from the switch 10 in that the relative positions of the ion source 28' and thermal switching element 24' are reversed, and that the thermal switching element 24' is also a conductor of positive ions. The metallization 26 may be omitted, or replaced by an ionic conductor 30'. The principle of operation is the same as for the embodiment of FIG. 1, with the thermal switching element 24' controlling positive ion flow between the source 28' and bistable switching element 22. Ion flow from the source 28' to the element 22 causes a complementary flow of electrons from the source 28' to the terminal 14.

Figure 3:
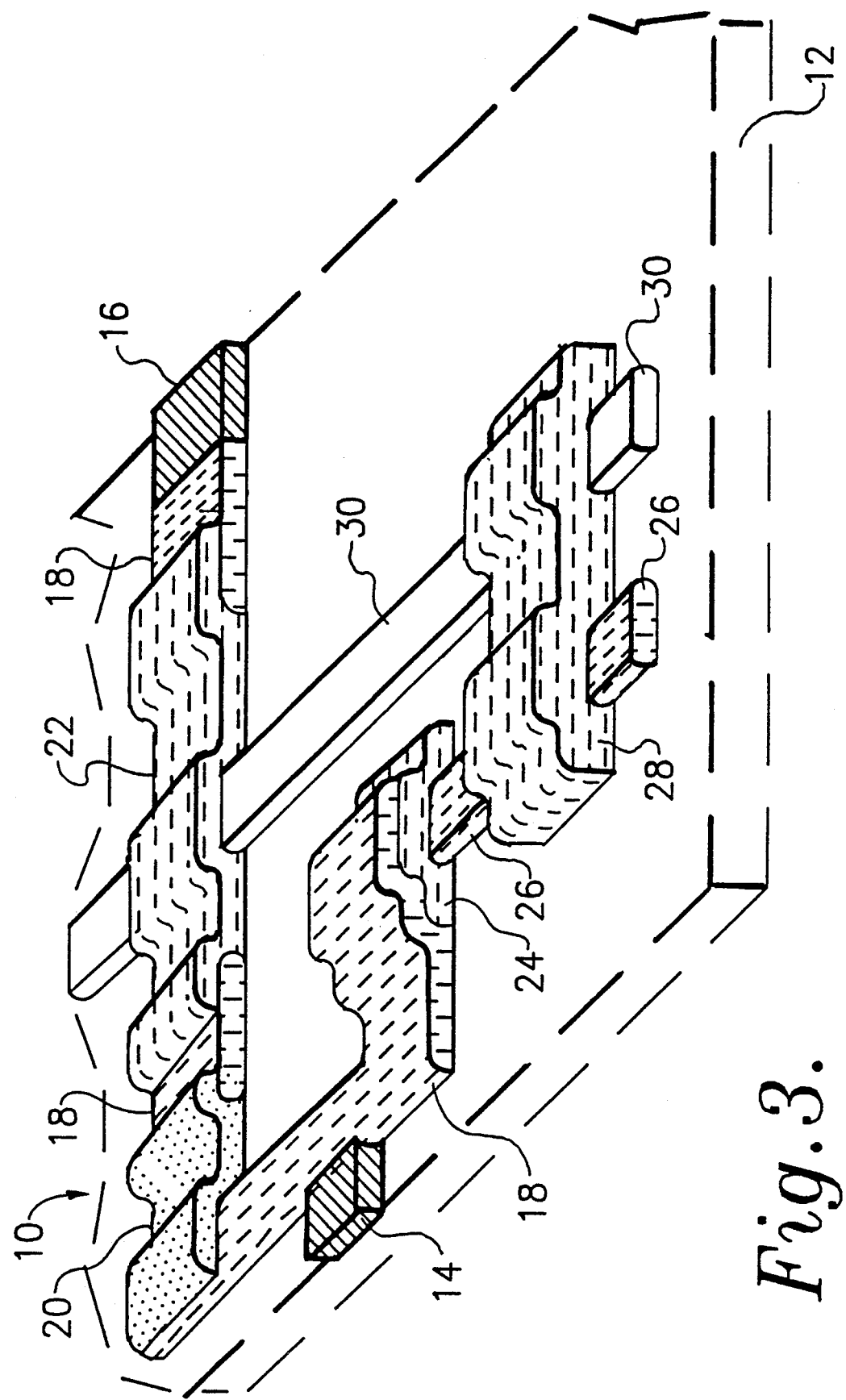
FIG. 3 is a diagrammatic perspective view, to an enlarged scale, of the switch illustrated in FIG. 1.
Figure 4:
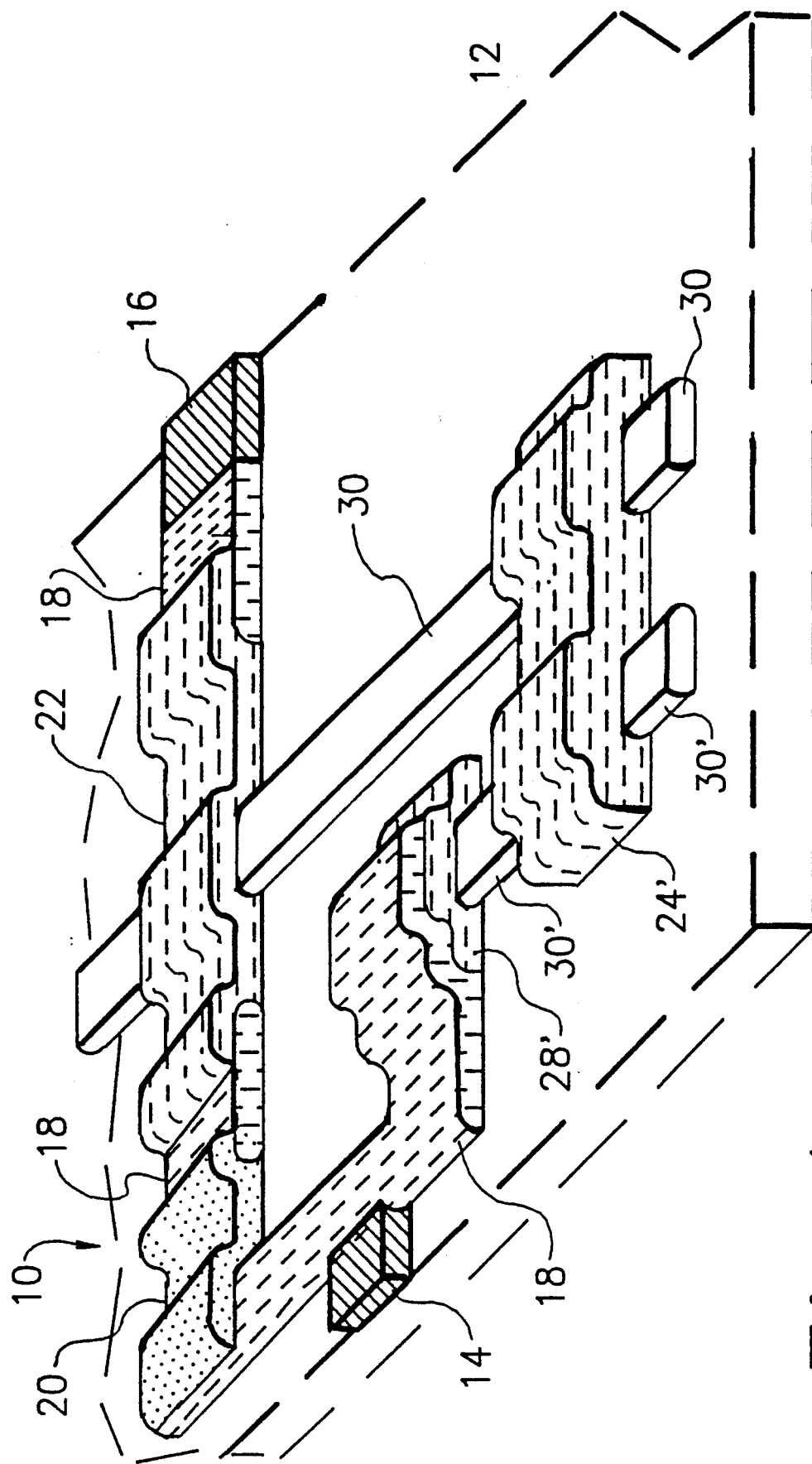
FIG. 4 is similar to FIG. 3, but illustrates the embodiment of FIG. 2.

Actual structures embodying the switches 10 and 10' are illustrated in enlarged perspective view in FIG. 3 and 4 respectively. These structures are based on the deposition properties of the switch component constituents.

In FIG. 3, the ionic conductor 30, corrosion resistant metallizations 18 and 26, and terminals 14 and 16 are first deposited on the substrate 12 as narrow layers. An additional section of metallization 18 is provided between the resistor 20 and bistable switching element 22 which does not appear in FIG. 1. The resistor 20 is deposited on the substrate 12, with its ends overlapping and interconnecting the adjacent metallizations 18. The bistable switching element 22 is deposited over an end portion of the ionic conductor 30, and between adjacent metallizations 18. The ion source 28 is deposited between and portions of the ionic conductor 30 and the metallization 26. The thermal switching element 24 is formed over the metallization 26. The section of the metallization 18 which connects to the terminal 14 and resistor 20 extends over the thermal switching element 24.

The switch 10' shown in FIG. 4 is similar to the switch 10, except that the ion source 28', ionic conductor 30', thermal switching element 24' replace the corresponding elements in the same relative positions in FIG. 3.

The ionic conductor 30 is a critical component which may be typically composed of a material such as beta or beta" alumina, with a mobile cation which may be selected from a large range of monovalent, divalent, and (for beta" only) trivalent cations. Detailed reviews of these beta and beta" materials are found in Kummer, J. T., Prog. Solid State Chem. (1972), 7, pp. 141-175: and Moseley, P. T., in "The Sodium Sulfur Battery," by Sudworth, J. L. et al, Chapman and Hall, N. Y. (1985) pp. 19-77. Beta" aluminas with divalent mobile ions are discussed in Farrington, G. C. et al, Solid State Ionics (1982), 7, pp. 267-281. Beta" aluminas with trivalent mobile ions are discussed in Carrillo-Cabrera et al, Solid State Ionics (1988), 28-30, pp. 317-323; and Sattar, S. et al, J. Solid State Chem. (1986), 65, pp. 231-240.

These materials are very refractory, and while they have been deposited by RF sputtering, may require an annealing step prior to fabrication of most other components. Relevant beta alumina deposition is discussed in Nobugai, K. et al, Materials Sci. Monogr. (1985), 28B, (React. Solid, Pt B), pp. 811-816; and Kanamaru, F. et al, Kenkyu Hokaku-Asahi Garasu Kogyo Gijutsu Shoreikai, (1987), 51, pp. 207-215.

For this reason, the ionic conductor 30 should be deposited before other components on a refractory substrate 12 such as alpha alumina ceramic or a single crystal material such as sapphire. The other components may all be deposited by evaporation, sputtering, or for certain non-volatile, low conductivity metal oxides, reactive sputtering from metal targets in a plasma containing oxygen.

The thermal switching element 24 may be made of any of several metal oxides which exhibit sharp conductivity increases above temperatures where phase transitions occur. These include $Ti_nO_{2n-1}$ ($2 \leq n \leq 60$) phases, $VO_2$, $V_2O_3$, and other $V_nO_{2n-1}$ phases, $NbO_2$, $EiO$, and many ternary oxides including, for example, Mo and Nb doped vanadium oxides. Relevant Metal-insulator transitions in metal oxides are discussed in Honig, J. M. et al, Annual Reviews of Materials Science, (1975), pp. 225-278; and Honig, J. M., J. Solid State Chem., (1982), 45, pp. 1-13.

A number of organic conductors also exhibit metal-insulator transitions, usually at low temperatures, but these would generally be less practical to apply in a small switch where a long life is required.

The ion conducting thermal switching element 24' may comprise any of a number of ionic salts with phase transitions which give rise to a high temperature ion conducting phase and a low temperature poorly conducting phase. Sodium molybdate is an example, with substantial conductivity above 480° C. and negligible conductivity at room temperature. A relevant $Na_2MoO_4$ system is discussed in Williams, R. M. et al, J. Electrochem. Soc., (1986), 133, pp. 2253-2257.

The ion source 28, and bistable switching element 22, may both comprise any of several metal oxides such as $TiO_2$, $V_2O_5$, $MoO_3$, $WO_3$, and others which are normally insulators or semiconductors, but which become metallic conductors when sufficient quantities of electropositive metals are added by addition of mono-, di-, or trivalent cations and electrons. Relevant discussions of metal oxide "bronzes" are presented in Sienko, M. J., "The Alkali Metals," The Chemical Society, London (1967), pp. 429-451; Sienko, M. J., "Advances in Chemistry Series, No. 39; Nonstoichiometric Compounds," The American Chemical Society (1963), pp. 224-236; Maazaz, A. et al, Inclusion Phenomena, (1983), 1, pp. 45-51; Reid, A. F. et al, Inorganic Chem., (1967), 6, pp. 321-324; Fuchs, R., J. Chem. Physics, (1965), 42, pp. 3781-3789; and Ostertag, W., Inorganic Chem., (1966), 5, pp. 758-760.

The ion source 28 is initially highly "doped" or "intercalated", and the switching element 22 is initially the stoichiometric, undoped metal oxide. The nature of the mobile cation will determine to some extent both the energy input required to switch, and the stability of the switch. With monovalent cations such as $Na^+$, migration from the ion source 28 through the ionic conductor 30, and into the switching element 22, can occur readily once the thermal switching element 24 or 24' is internally heated sufficiently by resistive heating to allow significant current to flow. For trivalent ions such as those of the lanthanides, the elements 28, 30, and 22 must also resistively heat up enough to allow current to flow, and in these cases the thermal switching element per se may be eliminated for some applications.

The resistance element 20 may be made of any stable resistive material, and may have to be protected by corrosion resistant metallization 18 on both sides. The corrosion resistant metallizations 18 and 26 may be made of a noble metal such as gold, a compound such as a metal silicide, or a passive metal such as nickel or tantalum, depending on the nature of the other components.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A non-volatile, electrically switchable, two resistance state circuit comprising in combination:
   first and second electrical contacts;
   a switching element connected to the first contact, said element having an electrical resistance which changes in response to the amount of positive ions present therewithin;
   a first circuit path, connected between the element and said second contact, through which a small sensing current may be transmitted to sense the resistance of the switching element;
   a second circuit path, also connected between the element and said second contact, independent from said first circuit path but electrically parallel to said first circuit path, said second circuit path including a source of positive ions in series with a variable resistance means, through which a larger resistance altering current may be transmitted to induce a flow of positive ions between said source and said switching element, said variable resistance means operable to block the small sensing current but operable to become more conductive in response to the larger resistance altering current.

2. The circuit of claim 1 in which said variable resistance means comprises a material that warms in response to said larger current and becomes less resistive at higher temperatures.

3. The circuit of claim 2 in which said material comprises a substance that experiences a thermal phase transition to a lower electrical resistance state above a predetermined temperature.

4. The circuit of claim 3 in which the predetermined temperature is about 30 degrees C.

5. The circuit of claim 3 in which said substance is selected from the group consisting of an oxide of vanadium, titanium, and tungsten.

6. The circuit of claim 1 in which the switching element comprises a compound that accepts positive ions from said source, so as to become more conductive, upon a flow of electrons out of the source toward the second contact.

7. The circuit of claim 5 in which the switching element comprises a compound that accepts positive ions within, so as to become more conductive, upon a flow of electrons out of the source to the second contact during said larger current.

8. The circuit of claim 6 in which said compound is selected from the group consisting of $TiO_2$, $V_2O_5$, $MoO_3$, and $WO_3$.

9. The circuit of claim 7 in which said compound is selected from the group consisting of $TiO_2$, $V_2O_5$, $MoO_3$, and $WO_3$.

10. The circuit of claim 1 in which said source comprises a compound selected from the group consisting of $NaTiO_2$, $Na_xMoO_3$, and $NaWO_3$ where x is less than or equal to 1.0.

11. The circuit of claim 8 in which said source comprises a compound selected from the group consisting of $NaTiO_2$, $Na_xMoO_3$, and $NaWO_3$ where x is less than or equal to 1.0.

12. The circuit of claim 9 in which said source comprises a compound selected from the group consisting of $NaTiO_2$, $Na_xMoO_3$, and $NaWO_3$ where x is less than or equal to 1.0.

13. The circuit of claim 1 including conductor means between said source and said variable resistance means operable to conduct positive ions but block electron flow.

14. The circuit of claim 13 in which said conductor means comprises beta alumina.

15. The circuit of claim 12 including conductor means between said source and said variable resistance means operable to conduct positive ions but block electron flow.

16. The circuit of claim 15 in which said conductor means comprises beta alumina.

17. The circuit of claim 1 in which the source is connected between the variable resistance means and the switching element.

18. The circuit of claim 1 including a resistor in said first circuit path.

19. The circuit of claim 1 formed on an insulative substrate, said substrate comprising a material selected from the group consisting of alpha alumina ceramic and sapphire.

20. The circuit of claim 16 formed on an insulative substrate, said substrate comprising a material selected from the group consisting of alpha alumina ceramic and sapphire and also including a resistor in said first circuit path and further in which the source is connected between the variable resistance means and the switching element.

* * * * *